United States Patent [19]

Dalman et al.

[11] Patent Number: 4,623,849
[45] Date of Patent: Nov. 18, 1986

[54] BROADBAND HIGH POWER IMPATT AMPLIFIER CIRCUIT

[75] Inventors: G. Conrad Dalman; Charles A. Lee, both of Ithaca, N.Y.

[73] Assignee: Cornell Research Foundation, Inc., Ithaca, N.Y.

[21] Appl. No.: 719,087

[22] Filed: Apr. 2, 1985

[51] Int. Cl.[4] ............................................. H03F 3/60
[52] U.S. Cl. ....................................... 330/287; 330/56; 331/101; 331/107 C
[58] Field of Search ............... 330/53, 54, 56, 286, 330/287; 331/101, 107 C, 107 DP, 107 R; 333/1.1, 263

[56] References Cited

U.S. PATENT DOCUMENTS

| | | | |
|---|---|---|---|
| 3,593,196 | 7/1971 | Haddad | 331/107 R |
| 3,621,463 | 11/1971 | Olson, Jr. | 331/101 |
| 3,673,510 | 7/1972 | Grace et al. | 330/287 |
| 3,673,514 | 6/1972 | Coleman, Jr. et al. | 331/107 R |
| 3,686,578 | 8/1972 | Upadhyayula et al. | 330/5 |
| 3,743,967 | 7/1973 | Fitzsimmons et al. | 331/107 R |
| 3,761,834 | 9/1973 | Dudley et al. | 330/287 |
| 3,784,926 | 1/1974 | Hall | 330/287 |
| 3,852,680 | 12/1974 | Rosen et al. | 330/286 |
| 3,868,588 | 2/1975 | Schwartzmann et al. | 331/77 |
| 3,909,740 | 9/1975 | Clorfeine | 330/287 |
| 3,943,463 | 3/1976 | Kuno et al. | 331/107 R |
| 3,946,336 | 3/1976 | Froom et al. | 331/107 R |
| 4,005,372 | 1/1977 | Ho et al. | 330/287 |
| 4,013,974 | 3/1977 | Quine | 330/287 |
| 4,021,750 | 5/1977 | Ho et al. | 330/287 |
| 4,025,872 | 5/1977 | Grayzel | 330/286 |
| 4,028,637 | 6/1977 | Gewartowski et al. | 331/107 R |
| 4,032,865 | 6/1977 | Harp et al. | 333/21 R |
| 4,050,032 | 9/1977 | Tserng | 330/287 |
| 4,056,784 | 11/1977 | Cohn | 330/287 |
| 4,070,627 | 1/1978 | Jasinski et al. | 325/127 |
| 4,097,823 | 6/1978 | Jerinic et al. | 332/9 R |
| 4,100,510 | 7/1978 | Reggiani et al. | 331/107 R |
| 4,118,598 | 10/1978 | Risko et al. | 325/26 |
| 4,121,174 | 10/1978 | Aston | 331/48 |
| 4,138,648 | 2/1979 | Hudspeth et al. | 330/4.9 |
| 4,184,123 | 1/1980 | Grill et al. | 330/56 |
| 4,232,277 | 11/1980 | Dickens et al. | 331/107 DP |
| 4,270,099 | 5/1981 | Gill et al. | 331/96 |
| 4,307,349 | 12/1981 | Thorpe et al. | 330/287 |
| 4,328,470 | 5/1982 | Bumgardner | 332/9 T |
| 4,359,700 | 11/1982 | Tresselt | 333/136 |

OTHER PUBLICATIONS

"Constant-Voltage Bias Improves Impatt Amps", J. W. McClymonds, *Microwaves*, Jul. 1980, pp. 64–66.

Primary Examiner—Eugene R. LaRoche
Assistant Examiner—Steven J. Mottola
Attorney, Agent, or Firm—Jones, Tullar & Cooper

[57] ABSTRACT

An IMPATT diode mounted in a double-tuned resonant cavity to exhibit stability by suppressing subharmonic frequencies is disclosed. A foreshortened quarter wavelength section is connected to the diode to form an equivalent parallel resonant circuit at one end thereof. At the other end of the quarter wavelength section is an odd-quarter wavelength tuning slug which provides a section which exhibits a second, series equivalent resonant circuit. To provide increased stability at subharmonic frequencies, a half-wavelength tuning slug is disposed adjacent to the odd-quarter wavelength section. The half wave tuning slug is virtually transparent at the operating frequency, but is a quarter-wavelength at the first subharmonic, and thus exhibits a high resistance at the subharmonic frequency.

10 Claims, 11 Drawing Figures

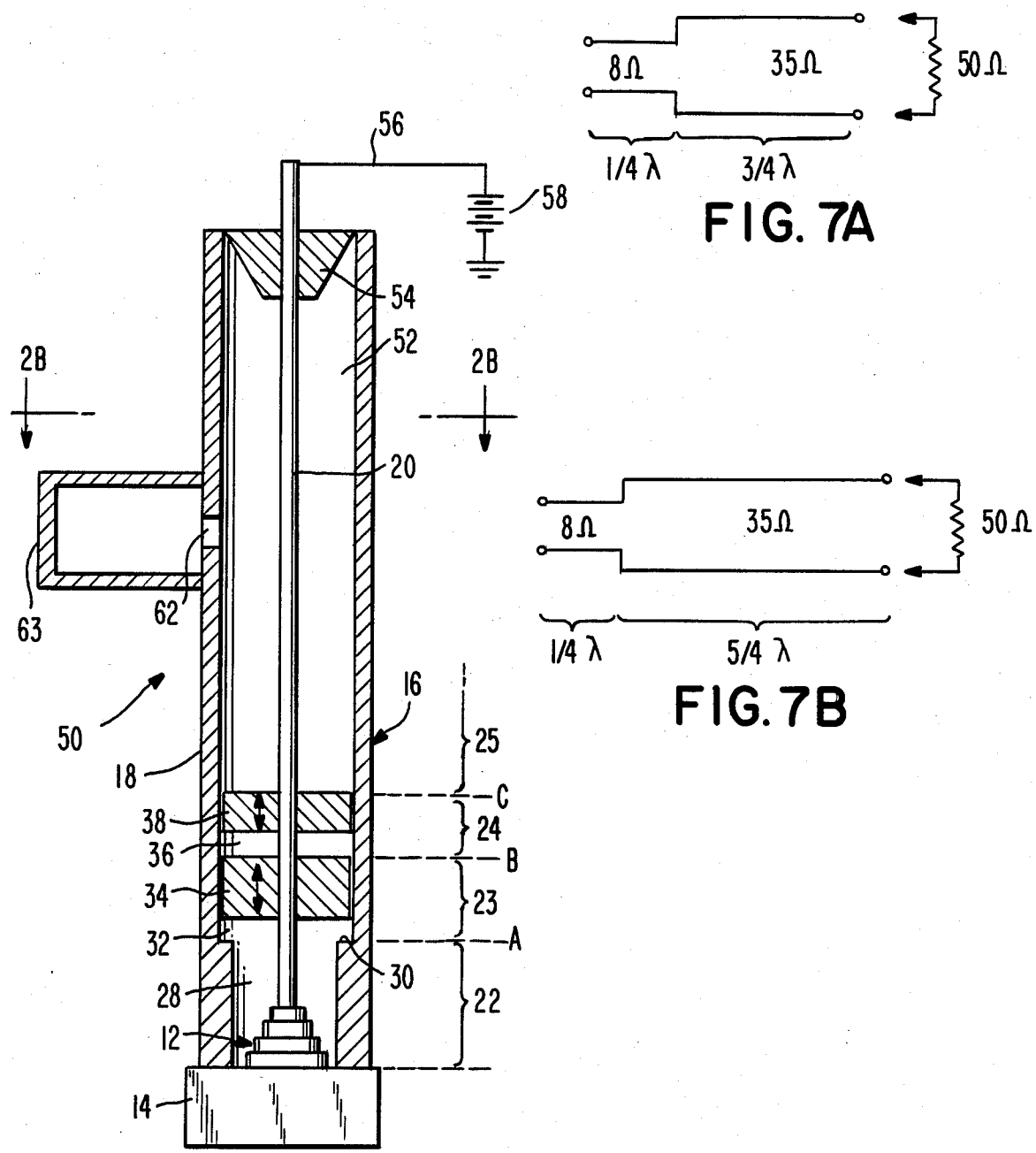
FIG. 2A
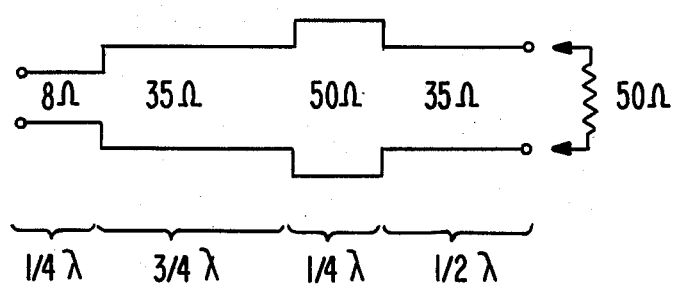
FIG. 7A
FIG. 7B
FIG. 7C

BROADBAND HIGH POWER IMPATT AMPLIFIER CIRCUIT

BACKGROUND OF THE INVENTION

This invention arose out of research sponsored by the U.S. Department of Defense under the Department of the Air Force Contract No. F-33615-81-R-1445.

The present invention relates, in general, to broadband amplifiers, and, more particularly, to an improved high-power IMPATT amplifier which exhibits multiple resonances in the operating band, while remaining stable at subharmonic frequencies.

IMPATT (Impact Avalance Transit Time) diode amplifiers for use at microwave frequencies and tunable over a wide bandwidth are known in the prior art, as exemplified by U.S. Pat. No. 3,943,463, to Kuno, et al. In this patent, a double-tuned amplifier circuit is disclosed in which a negative resistance semiconductor diode, and as an IMPATT diode, is loaded in mutually perpendicular directions by adjustable tuning elements. These tuning elements operate to match the real and imaginary components of the diode impedance to the real and imaginary components of the load impedance, respectively, at a particular operating frequency to maximize power transfer to the load.

U.S. Pat. No. 4,013,974, to Quine, is another example of a known IMPATT diode amplifier. In this patent, the diode is connected to a two-section microstrip transmission line transformer to obtain broadband impedance matching. Each section is approximately one-quarter wavelength long at a selected microwave frequency. A tuning slug in the form of an absorbing resistance is movably mounted in the diode cavity to permit tuning of the circuit to optimize performance.

U.S. Pat. No. 4,032,865, to Harp, et al., discloses an active radial-to-coaxial transmission line utilizing an IMPATT diode positioned in a radial line. This radial transmission line transforms the low impedance of the diode at its center to a substantially higher value at its outer periphery where contact to a coaxial line may be achieved with good impedance matching to maximize power transfer.

Although the foregoing patents illustrate that techniques for designing broadband IMPATT amplifiers are well-developed, special problems still exist in the art. The most difficult of these problems is the achievement of broadband, high-power amplification while controlling subharmonic instabilities which arise from parametric pumping of the diode admittance at high power levels, where diode voltage modulation may exceed fifty percent. Such instabilities lead to the generation of subharmonic oscillations when high-performance diodes are used, and in many cases will lead to diode burnout or inferior performance, since subharmonic frequencies draw power that would otherwise be available at the fundamental frequency, and result in power losses at that desired frequency. A good, high-power, broadband circuit design requires at least a doubly resonant equivalent circuit in the desired operating band, and must present a stable termination to the diode in first subharmonic frequency range in order to prevent subharmonic oscillations and the generation of other spurious signals.

SUMMARY OF THE INVENTION

It is an object of the present invention to provide an improved broadband, high-power IMPATT amplifier which is stable at subharmonic frequencies.

It is another object of the invention to provide an IMPATT diode amplifier having a doubly resonant equivalent circuit in a selected operating band, and having a stable termination to the diode in the first subharmonic frequency range.

The present invention, in a preferred embodiment, includes an IMPATT diode connected to one end of a three-section coaxial waveguide structure. The first section of the structure is a foreshortened quarter-wave section. The diode is connected to one end of this section, and a parallel resonance is formed at the opposite end of the section when the diode reactance and package parasitic reactances are taken into account. The second section of the coaxial waveguide is an odd (e.g., 1, 3, 5, etc.) quarter-wavelength section which provides a second resonance for the diode circuit. This second section may include a moveable tuning slug of selected diameter and selected dielectric constant to permit adjustment of resonant frequency for the section. The third section of the line may be a 50 Ohm coaxial transmission line which may be connected by way of conventional transmission line or wave guide components such as a circulator to the signal input source and to a matched load.

Although the foregoing circuit is stable for most diodes, additional stabilization may be required for high power diodes. This may be achieved by inserting a half-wavelength moveable tuning slug in the third transmission line section. Such an element is substantially transparent at the selected fundamental frequency of the amplifier, but it appears as a quarter-wavelength impedance at the first subharmonic, and consequently has substantial effect at that frequency. This allows the subharmonic frequency to be tuned with relatively little effect on the diode termination at the fundamental frequency.

The present circuit satisfies the requirements of multiple resonances in the operating band, and stability at subharmonic frequencies. The circuit is extremely simple geometrically, which promotes ease of manufacture and the attainment of high circuit efficiency. The use of a coaxial line is preferred, since a waveguide structure imposes a frequency cutoff, while a coaxial line allows broadband termination down to d.c. signals, thus easing stability problems. Further, a coaxial line provides flexibility of operation, since the tuning slugs can be moved easily relative to the diode cavity section, making it possible to trim the circuit for optimal operation. Further, spurious modes are not present in a coaxial circuit, and such a circuit makes it easier to provide a good diode heat sink.

BRIEF DESCRIPTION OF THE DRAWINGS

The foregoing, and additional objects, features, and advantages of the present invention will become apparent from a consideration of the following detailed description of preferred embodiments thereof taken with the accompanying drawings, in which:

FIG. 2A is a diagrammatic illustration in partial section of the amplifier circuit of FIG. 1 utilized with a waveguide output circuit, and taken along line 2A—2A of FIG. 2B.

FIGS. 7A-7C illustrate the changes in transmission line structure used in calculating the plots of FIG. 8.

DESCRIPTION OF PREFERRED EMBODIMENTS

Figure 1:
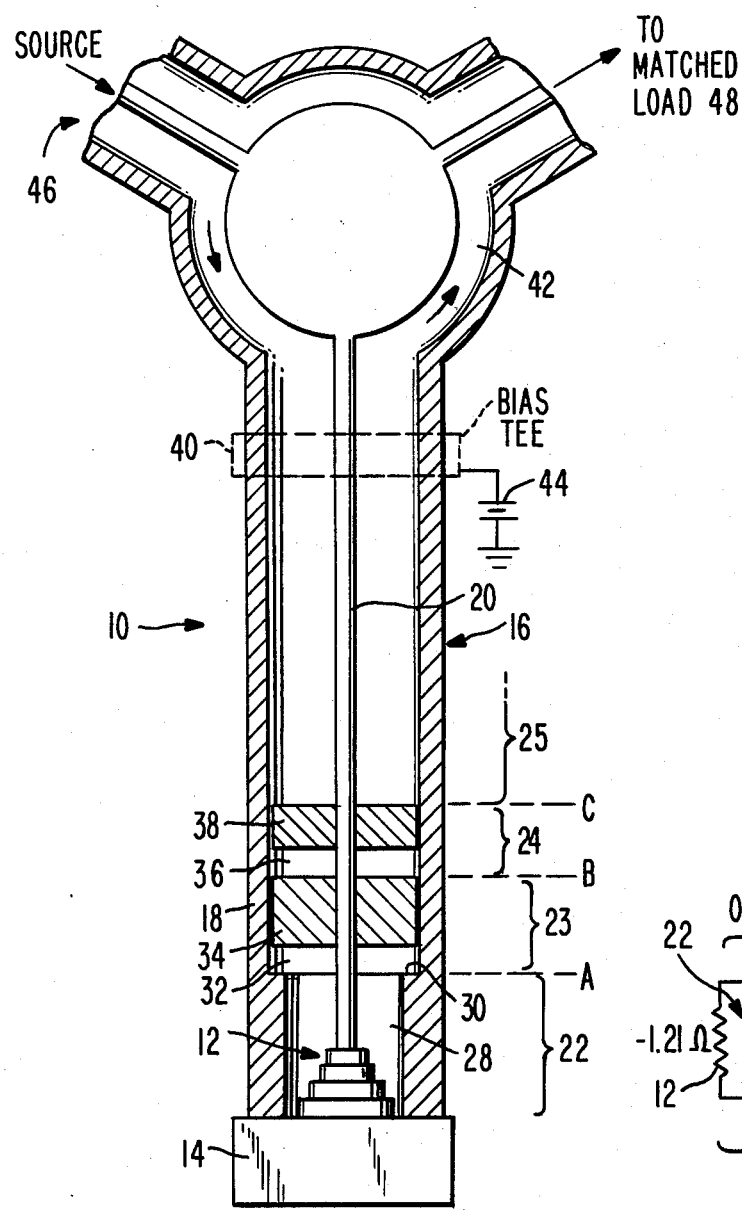
FIG. 1 is a diagrammatic illustration in partial section of a high-power broadband amplifier circuit connected to a coaxial output, in accordance with the invention.

Turning now to a more detailed consideration of the present invention, there is shown in FIG. 1 in diagrammatic form a high-power, broadband amplifier circuit 10 which includes a conventional IMPATT diode 12 mounted on a heat sink 14. The diode is mounted in one end of a structure which in this embodiment of the invention is a coaxial transmission line 16 having an outer conductor 18 and an inner conductor 20.

The amplifier 10 is made up of three sections, connected to a fourth transmission line section. A first section 22 extends between the diode end of the line, at heat sink 14, and plane A; a second section 23 extends between planes A and B; a third section 24 extends from plane B to plane C; and a fourth section 25 extends outwardly from plane C. The first section 22 is connected by way of heat sink 14 to one end of the diode 12 and surrounds it to form a diode cavity 28. The inner conductor 20 is connected to the opposite end of the diode 12. Section 22 is a foreshortened quarter-wave section designed to form a parallel resonance with the diode 12 when the diode reactance and package parasitic reactances are taken into account.

Plane A lies at the junction between sections 22 and 23 of the coaxial line 16, where transformer 30 in the form of a discontinuity, or shoulder, on the interior surface of conductor 18 joins the larger diameter line section 23 to the smaller diameter line section 22. The second line section 23 is an odd quarter-wavelength section (e.g., a ¼, ¾ or 5/4 wavelength section) which provides the second resonance point for broadband operation. This second section has a cavity 32 in which is mounted a moveable tuning slug 34 surrounding the central conductor 20. Alternatively, the resonance point may be produced by means of a machined recess in the outer or inner conductors 18 or 20. The diameter of slug 34 and its material are selected so that it provides a predetermined characteristic impedance. Movement of the impedance within the cavity tunes the circuit to a resonance point at the fundamental frequency of the signal to be amplified.

In the preferred form of the present invention, section 24 includes a tuning slug 38 and a cavity 36 to provide additional stabilization at subharmonic frequencies. Such additional stabilization may be needed for high-power diodes. Slug 38 is a half-wavelength at the fundamental frequency, and thus is selected to have an impedance which is substantially transparent to the fundamental frequency of the signal to be amplified. However, the slug 38 is a quarter-wavelength at the first subharmonic frequency, and thus produces a higher reflection to such signals, allowing the subharmonics to be tuned out of the signal to be amplified with relatively little effect on the diode operation in the desired frequency range. The material and the dimensions of slug 38 are selected to provide a predetermined characteristic impedance, and the slug is moveable in cavity 36 to provide a second resonance point in the amplifier circuit 10. This second resonance point provides the required relatively large impedance to subharmonics of the signal to be amplified to prevent the subharmonic oscillations which create power losses at the fundamental frequency.

Both slug 34 and slug 38 are moveable to tune the circuit to permit compensation for the parasitic inductance and capacity of the diode 12. Slug 38 is essentially transparent at the fundamental operating frequency of the circuit, while providing substantial impedances to subharmonics of the fundamental frequency. Thus, the slugs increase the equivalent series resistance of the circuit 10 seen by the diode at subharmonic frequencies, while establishing resonance at the fundamental frequency.

In the embodiment of FIG. 1, the fourth section 25 comprises a conventional coaxial line having a nominal 50-ohm impedance. Conductors 18 and 20 are connected through a bias tee 40 to a conventional input/output device such as a circulator 42. The bias tee connects the coaxial line 16 to a source 44 of DC bias in known manner, while circulator 42 connects the amplifier 10 to a signal source 46 and to a matched load 48.

Figure 2B:
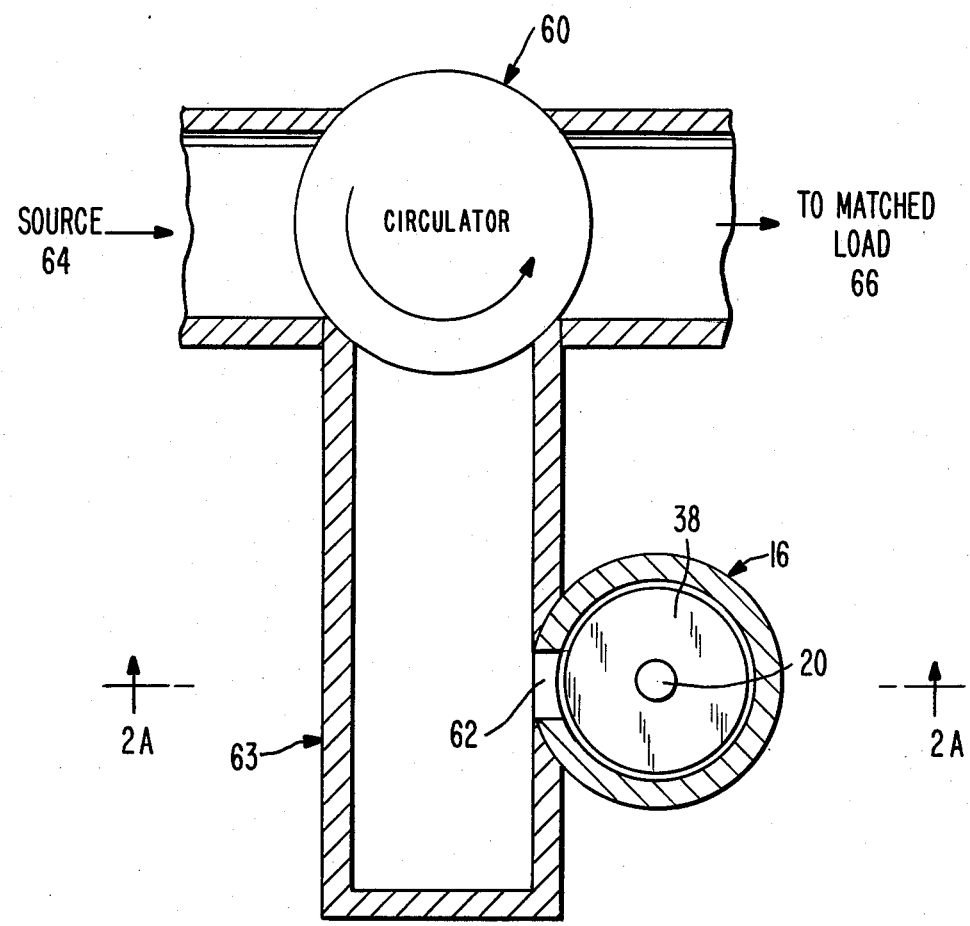
FIG. 2B is a cross-sectional view taken along line 2B—2B of FIG. 2A.

A modified version of the device of FIG. 1 is illustrated in FIGS. 2A and 2B, wherein features common to both embodiments are similarly numbered. The modified amplifier 50, comprising sections 22, 23, and 24 as previously discussed, is connected in this embodiment to a fourth section 25 which includes a coaxial transmission line section 52. The conductor 20 in this section is connected through a matched terminating load 54 to a bias lead 56, and thence to a bias source 58. As shown in FIG. 2B, the amplifier is connected to an input/output device such as a circulator 60 by way of an iris coupling 62 and a suitable waveguide 63.

The coupling 62 produces the required impedance to input signals from a source 64 over the passband at the fundamental frequency. The coupling 62 appears as a short circuit to signals outside the amplifier passband in the coaxial line 52. Power at the subharmonic frequency which is not eliminated in 16 by slug 38 is dissipated at the terminating load 54, and does not reach matched load 66, also connected to circulator 60.

The operation of the amplifier circuit of section 22, 23 and 24 of both FIG. 1 and FIGS. 2A and 2B is similar, only the application of the circuit to different transmission lines distinguishes the figures. Accordingly, the following description will be in terms of the FIG. 1 illustration, but it will be understood to be applicable to FIGS. 2A and 2B and to other applications as well.

Figure 3:
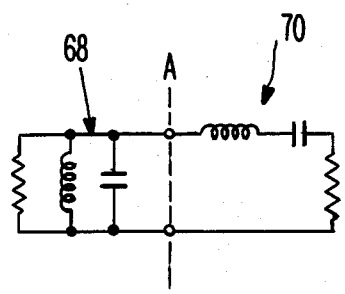
FIG. 3 is a schematic lumped equivalent circuit at reference plane A in the circuit of FIG. 1.

The diode 12 and the first section 22 of the transmission line 16 in FIG. 1 constitute an equivalent parallel resonant circuit as viewed from plane A, as illustrated by the parallel circuit 68 in FIG. 3. Looking from plane A toward plane B in FIG. 1, sections 24 and 25 appear as a load resistance higher than the characteristic impedance of section 23 at the fundamental frequency, and this can be represented by an equivalent series resonant circuit 70 in FIG. 3.

Figure 4:
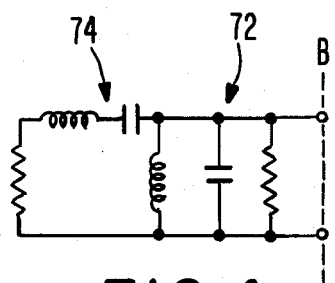
FIG. 4 is a schematic lumped equivalent circuit from reference plane B in FIG. 1.

Transforming the equivalent circuit three quarters of a wavelength to plane B at the end of section 23 results in the series resonant circuit 70 being transformed to a parallel circuit 72, and the parallel resonant circuit 68 being transformed to a series circuit 74, as illustrated in the lumped equivalent circuit of FIG. 4.

Figure 6:
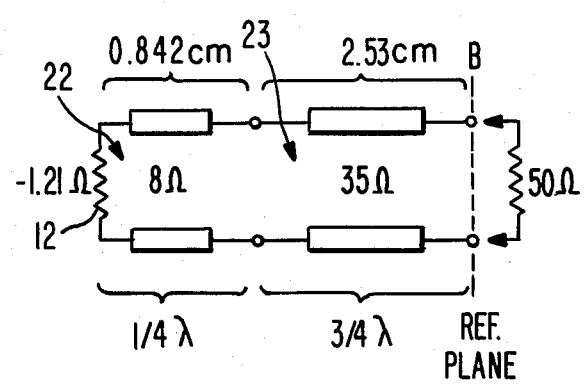
FIG. 6 illustrates the transmission line parameters assumed in calculating the plot of FIG. 5.
Figure 5:
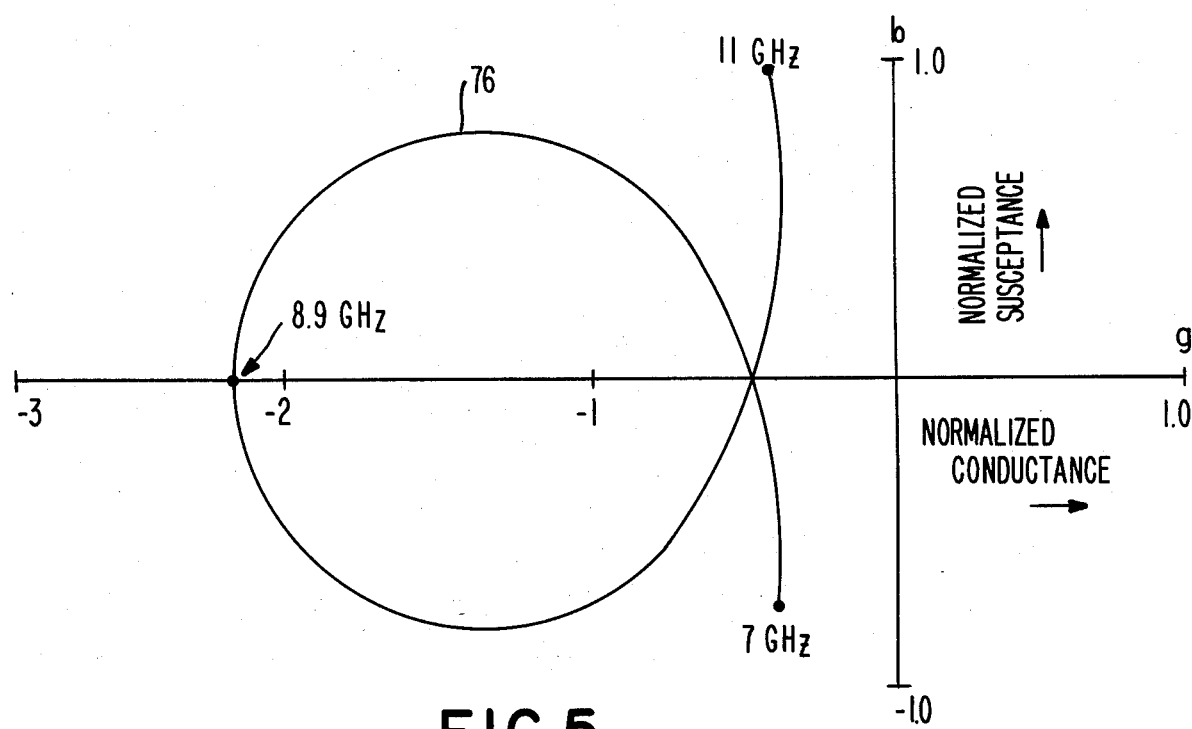
FIG. 5 is a plot of the normalized diode cavity admittance at reference plane A of FIG. 1.

Calculations of the admittance characteristics of an amplifier using only the tuning slug 34 in the device of FIG. 1 produces the classic double resonance graph 76 of FIG. 5. Thus, as calculations are made for different frequencies between 7 GHz and 11 GHz, three resonance points occur, where b=0. The calculations were made using the assumed transmission line parameters illustrated in FIG. 6, wherein section 22 exhibits an impedance of 8 ohms, section 23 exhibits an impedance of 35 ohms, the coaxial line exhibits an impedance of 50 ohms in the absence of slug 38, and the IMPATT diode 12 exhibits a negative impedance of $-1.21$ ohms. FIG. 5 illustrates in curve 76 changes in the normalized conductance of the circuit of FIG. 1 at the reference plane B, which is situated at the end of the three-quarter wavelength section 23, as viewed from the line looking toward the diode. This conductance behavior is modelled by the lumped equivalent circuit of FIG. 4, looking from plane B.

Figure 8:
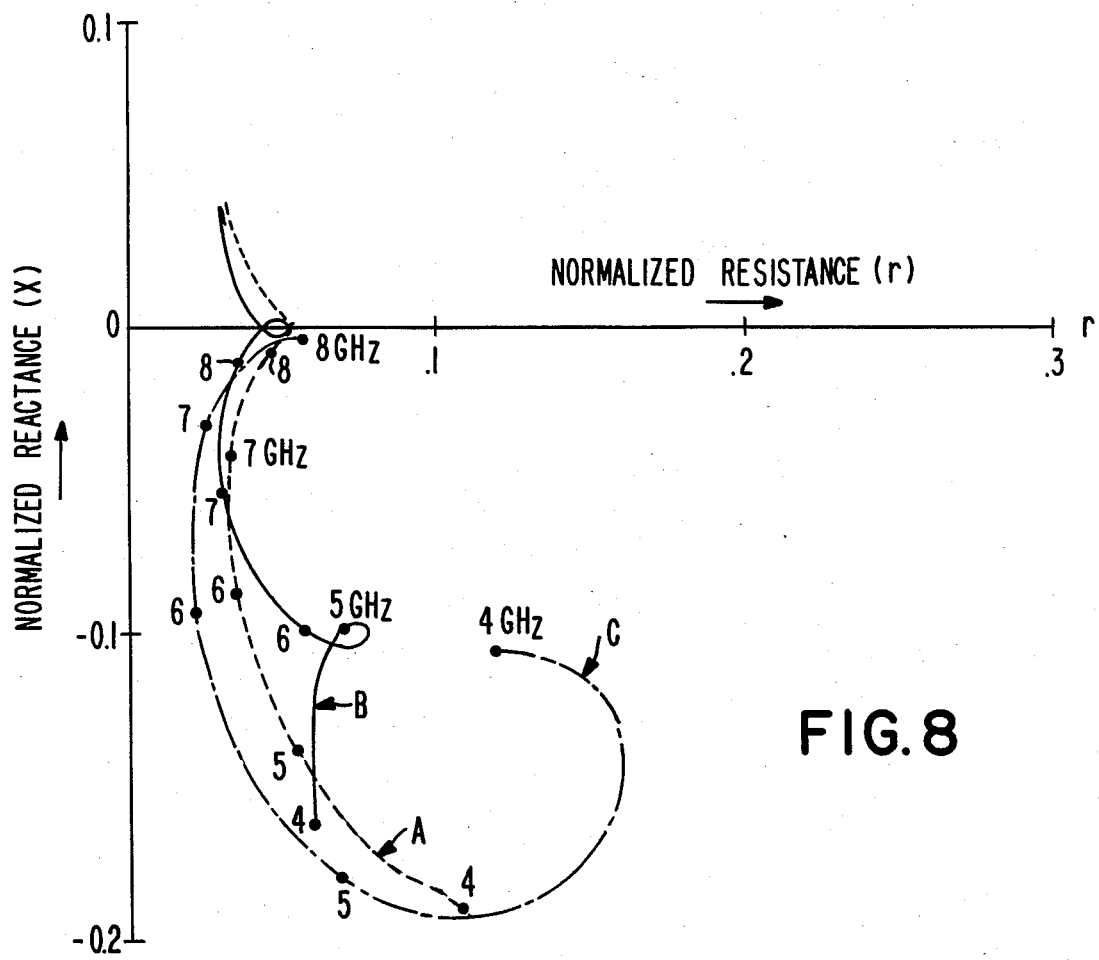
FIG. 8 shows plots of the normalized impedance presented to the diode for two positions of the half-wavelength tuning element of FIG. 1.

The impedances presented to the diode by the amplifier circuit for various configurations are illustrated in FIGS. 7A-7C, assuming a 50 ohm transmission line termination, and are plotted in FIG. 8. The configuration of the device of FIG. 1 without slug 38 is illustrated in FIG. 7A, wherein transmission line section 22 is shown as having a characteristic impedance of 35 ohms. This circuit terminates in a coaxial structure having an impedance of 50 ohms. Curve A in FIG. 8 illustrates the normalized impedance presented to diode 12 by this structure, over frequencies from 4 GHz to 9 GHz.

A careful study of curve A in FIG. 8 reveals that as the frequency increases from 4 GHz to 9 GHZ, the normalized resistance r passes through two peaks, one at about 0.1 and the other at about 0.05. This illustrates the two resonant points of the circuit produced using only tunable slug 34 in the circuit of FIG. 7A. If the slug 38 is inserted immediately adjacent slug 34, it will be seen from curve B that the resonant points become more pronounced. In fact, the shape of the normalized curve B in the region of the r axis is substantially the same as that of curve 76 in FIG. 5, although it is reversed, since FIG. 8 is a plot of circuit impedance as viewed from the diode, whereas FIG. 5 is a plot of admittance as viewed from the load end.

FIG. 7C represents the impedance of the device of FIG. 1 where the slug 38 has been spaced from slug 34 by ¼ wavelength, tuning the circuit to provide additional impedance at the subharmonic frequencies, as reflected in curve C of FIG. 8. This curve C illustrates the improved impedance obtained at subharmonic frequencies, showing, for example, a normalized resistance of about 0.06 at 8.9 GHz, and a normalized resistance of about 0.16 at 4.45 GHz, the first subharmonic of the fundamental.

In the amplifier circuit of FIGS. 1, 2A and 2B, only the fundamental frequency of the source signal appears across the diode 12. The double-tuned feature of the amplifier circuit makes it possible for the fundamental frequency of the source to appear across the diode over a broad band of frequencies without the presence of any other frequency, especially without the first subharmonic frequency. The second tuning slug 38 provides additional stabilization at subharmonic frequencies. As shown in the figures, the circuit loss at subharmonic frequencies can be varied considerably without appreciably affecting the circuit tuning in the operating band.

The doubly resonant circuit provided by the cavities 32 and 36 and the tuning slugs 34 and 38 is matched to the IMPATT diode 12 to obtain efficient wide band amplification. The lengths and diameters of the slugs are selected, and the lengths of the cavities are adjusted to achieve the desired bandwidth and efficiency of operation by matching the diode admittance. At high power extremes the ½ wave slug 38 is adjusted to suppress subharmonic instabilities. The coaxial line 16 conducts the amplified output signal to the circulator and thence to a matched load.

Thus, there has been described an IMPATT amplifier circuit which produces high power with exceptional electrical stability at subharmonic frequencies, with a mechanical simplicity which makes the circuit desirable for practical amplifier designs. Although the above description has dealt with a coaxial design at the X-band, it should be noted that variations in the coupling to waveguide structures can be accomplished without departing from the invention. For example, the present cavity design could be iris coupled to a waveguide structure accommodating a number of similar cavities. Further, the device has useful applications in the millimeter wavelength frequencies.

The bandwidth and the stability of the present device make it particularly advantageous for power combining applications where bandwidths of more than a few percent have not previously been achieved with IMPATT amplifiers. For such applications, frequencies in the operating band are coupled to the waveguide structure, but all of the lower (subharmonic) frequencies are conveniently terminated in a coaxial TEM structure.

What is claimed is:

1. A tunable microwave structure for amplification of a signal at a selected operating frequency and for suppression of subharmonic frequencies, comprising:
   an IMPATT diode;
   a first, quarter-wavelength coaxial transmission line section having an outer wall of a first inner diameter surrounding and in contact with a first end of said diode and an inner conductor in contact with a second end of said diode, said first section forming a parallel resonance with said diode at the operating frequency;
   a second, odd quarter-wavelength coaxial transmission line line section adjoining said first transmission line section, the junction between said first and second sections defining a first reference plane, said second section having an outer wall of a second inner diameter, said second inner diameter being larger than said first inner diameter; and
   adjustable tuning slug means in said second transmission line section for providing a second resonance with said diode at the operating frequency, whereby said microwave structure has multiple resonances at said operating frequency while providing an increased impedance to subharmonics of said operating frequency.

2. The structure of claim 1, wherein said tuning slug is moveably mounted within said second transmission line section.

3. The structure of claim 1, wherein said second transmission line section has a length of one-quarter the wavelength of a signal having said operating frequency.

4. The structure of claim 1, wherein said second transmission line section has a length of three-quarters the wavelength of a signal having said operating frequency.

5. The structure of claim 4, wherein said first transmission line section forms an equivalent parallel resonant circuit and said second transmission line section forms an equivalent series resonant circuit at said reference plane.

6. The structure of claim 5, wherein said tuning slug is moveably mounted within said second transmission line section.

7. The structure of claim 6, further including a third coaxial transmission line section adjoining said second transmission line section, the junction between said second and third sections defining a second reference plane, said third coaxial transmission line section connecting said tunable transmission line structure to a signal source and to a matched load.

8. The structure of claim 7, further including second adjustable tuning means in said third transmission line section.

9. The structure of claim 8, wherein said second tuning means has a length of one-half the wavelength of a signal having said operating frequency.

10. The structure of claim 9, wherein said second tuning means is a tuning slug.

* * * * *